United States Patent
Wang et al.

(10) Patent No.: US 12,402,490 B2
(45) Date of Patent: Aug. 26, 2025

(54) METHOD FOR MANUFACTURING AN ISOLATION AREA WITHIN A HOLING AREA AND A DISPLAY AREA OF A DISPLAY PANEL

(71) Applicant: Yungu (Gu'an) Technology Co., Ltd., Hebei (CN)

(72) Inventors: Shoukun Wang, Kunshan (CN); Shaoyang Qin, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 785 days.

(21) Appl. No.: 17/525,156

(22) Filed: Nov. 12, 2021

(65) Prior Publication Data
US 2022/0077438 A1 Mar. 10, 2022

Related U.S. Application Data

(63) Continuation of application No. PCT/CN2020/107393, filed on Aug. 6, 2020.

(30) Foreign Application Priority Data

Nov. 20, 2019 (CN) .......................... 201911138907.3

(51) Int. Cl.
H10K 71/00 (2023.01)
H10K 50/844 (2023.01)
(Continued)

(52) U.S. Cl.
CPC .......... *H10K 71/00* (2023.02); *H10K 50/844* (2023.02); *H10K 77/10* (2023.02); *H10K 59/1201* (2023.02)

(58) Field of Classification Search
CPC ...... H10K 71/00; H10K 77/10; H10K 50/844; H10K 59/1201
(Continued)

(56) References Cited

U.S. PATENT DOCUMENTS 10,868,102 B1 12/2020 Zhang et al.
2005/0118827 A1* 6/2005 Sato .................. H01L 27/12
257/E21.252
(Continued)

FOREIGN PATENT DOCUMENTS

CN 109802052 A 5/2019
CN 110265471 A 9/2019
(Continued)

OTHER PUBLICATIONS

Office Action issued on Jan. 1, 2024, in corresponding Korean Application No. 10-2022-7007642, 11 pages.
(Continued)

*Primary Examiner* — Eric W Jones
(74) *Attorney, Agent, or Firm* — Maier & Maier, PLLC

(57) ABSTRACT

A display panel includes a display area, a holing area and an isolation area disposed between the display area and the holing area. The method for manufacturing the display panel includes: forming a support layer disposed in the holing area and the isolation area on a substrate, the support layer includes a first support sub-layer and a second support sub-layer, a projection of the first support sub-layer on the substrate is in the holing area, a projection of the second support sub-layer on the substrate is in the isolation area; forming a first blocking layer on the support layer, the first blocking layer includes a first blocking sub-layer disposed on the first support sub-layer and a second blocking sub-layer disposed on a grooving portion of the second support sub-layer; etching the second blocking sub-layer to expose the grooving portion; obtaining grooves and isolation columns by etching the grooving portion.

18 Claims, 10 Drawing Sheets

(51) Int. Cl.
  *H10K 59/12* (2023.01)
  *H10K 77/10* (2023.01)
(58) Field of Classification Search
  USPC .............................................. 257/40, 59, 88
  See application file for complete search history.

(56) References Cited

U.S. PATENT DOCUMENTS

| | | | |
|---|---|---|---|
| 2005/0197030 A1* | 9/2005 | Yamazaki | H10K 59/12 |
| | | | 445/24 |
| 2006/0063351 A1* | 3/2006 | Jain | G02F 1/1368 |
| | | | 438/455 |
| 2007/0254490 A1* | 11/2007 | Jain | G02F 1/1362 |
| | | | 257/E21.258 |
| 2017/0077437 A1* | 3/2017 | Kaida | H10K 50/81 |
| 2017/0148856 A1 | 5/2017 | Choi et al. | |
| 2017/0365487 A1* | 12/2017 | Shen | H01L 21/30604 |
| 2018/0083087 A1* | 3/2018 | Choi | H10K 50/824 |
| 2019/0355930 A1* | 11/2019 | Lee | H10K 50/844 |
| 2020/0235333 A1* | 7/2020 | Sung | H10K 59/124 |
| 2021/0376293 A1 | 12/2021 | Zhao et al. | |
| 2022/0013601 A1 | 1/2022 | Deng et al. | |

FOREIGN PATENT DOCUMENTS

| | | |
|---|---|---|
| CN | 110265583 A | 9/2019 |
| CN | 110416282 A | 11/2019 |
| CN | 110416435 A | 11/2019 |
| CN | 110429118 A | 11/2019 |
| CN | 110444576 A | 11/2019 |
| CN | 110444690 A | 11/2019 |
| CN | 110459700 A | 11/2019 |
| CN | 110854304 A | 2/2020 |
| JP | 2011505687 A | 2/2011 |
| JP | 2013102154 A | 5/2013 |
| JP | 2015109429 A | 6/2015 |
| JP | 201627626 A | 2/2016 |
| KR | 20170097816 A | 8/2017 |
| WO | 2013011602 A1 | 1/2013 |

OTHER PUBLICATIONS

Chinese Office Action and Search Report issued on Dec. 22, 2020 in corresponding Chinese Application No. 201911138907.3; 10 pages.
International Search Report issued on Nov. 12, 2020 in corresponding International Application No. PCT/CN2020/107393; 5 pages.
International Written Opinion issued on Nov. 12, 2020 in corresponding International Application No. PCT/CN2020/107393; 7 pages.
Office Action issued on Apr. 11, 2023, in corresponding Japanese Application No. 2022515867, 10 pages.
Japanese Patent Office Action, issued Oct. 3, 2023, in corresponding Japanese Application No. 2022-515867, 8 pages.
Extended European Search Report issued on Dec. 14, 2022, in corresponding European Application No. 20888785.1, 9 pages.

* cited by examiner

METHOD FOR MANUFACTURING AN ISOLATION AREA WITHIN A HOLING AREA AND A DISPLAY AREA OF A DISPLAY PANEL

CROSS REFERENCE TO RELATED APPLICATIONS

The present application is a continuation of International Application No. PCT/CN2020/107393, entitled "METHOD FOR MANUFACTURING DISPLAY PANEL, DISPLAY PANEL AND DISPLAY DEVICE", and filed on Aug. 6, 2020. International Application No. PCT/CN2020/107393 claims priority to Chinese Patent Application No. 201911138907.3 entitled "METHOD FOR MANUFACTURING DISPLAY PANEL, DISPLAY PANEL AND DISPLAY DEVICE" filed on Nov. 20, 2019. The entire contents of each of the above-listed applications are hereby incorporated by reference for all purposes.

TECHNICAL FIELD

The present disclosure relates to the technical field of OLED display devices, and in particular to a method for manufacturing a display panel, a display panel and a display device.

BACKGROUND

Along with rapid development of display devices, users have higher and higher requirements for screen-to-body ratios. Since elements such as cameras, sensors and receivers have to be mounted on the top of a screen, a holing area is usually reserved on the top of the screen for mounting these elements so as to realize a high screen-to-body ratio in the related art.

SUMMARY

The present disclosure provides a method for manufacturing a display panel to solve shortcomings of the related art.

According to a first aspect of the implementations of the present disclosure, provided is a method for manufacturing a display panel. The display panel includes a display area, a holing area and an isolation area, and the isolation area is disposed between the display area and the holing area, and the isolation area at least partially surrounds the holing area. The method includes:
 forming a support layer on a substrate, wherein the support layer is disposed in the holing area and the isolation area, the support layer includes a first support sub-layer and a second support sub-layer, a projection of the first support sub-layer on the substrate is disposed in the holing area, and a projection of the second support sub-layer on the substrate is disposed in the isolation area;
 forming a first blocking layer on the support layer, wherein the first blocking layer includes first blocking sub-layer and a second blocking sub-layer, the first blocking sub-layer is disposed on the first support sub-layer, and the second blocking sub-layer is disposed on a grooving portion of the second support sub-layer;
 etching the second blocking sub-layer to expose the grooving portion;
 at least etching the grooving portion to obtain grooves and isolation columns, wherein the isolation columns and the grooves are distributed alternately.

According to a second aspect of the implementations of the present disclosure, provided is a display panel. The display panel is manufactured by using the above method for manufacturing a display panel.

According to a third aspect of the implementations of the present disclosure, provided is a display device. The display device includes: a device body including a component area; and the display panel as described above. The display panel covers the device body, and a holing area of the display panel corresponds to the component area.

As can be known from the above implementations, the first support sub-layer disposed in the holing area and the second support sub-layer disposed in the isolation area are formed in the substrate, the first blocking sub-layer is formed on the first support sub-layer and the second blocking sub-layer is formed on the grooving portion of the second support sub-layer. Then, the second blocking sub-layer is etched to expose the grooving portion, and the grooves and the isolation columns are obtained by at least etching the grooving portion, wherein the isolation columns and the grooves are distributed alternately. In this case, when an organic light-emitting material layer is evaporated, the organic light-emitting material layer will be automatically cut off at a side wall of the groove or at a side wall of the isolation column without using external force, so as to block the path of diffusion of water and oxygen, prevent water and oxygen from diffusing from the holing area to the display panel, avoid interference of external devices (for example, laser device) and reduce the costs.

It should be understood that the above general descriptions and subsequent detailed descriptions are merely illustrative and explanatory and shall not be intended to limit the present disclosure.

BRIEF DESCRIPTION OF THE DRAWINGS

The accompanying drawings, which are incorporated in and constitute a part of the present description, illustrate examples consistent with the present disclosure and serve to explain the principles of the present disclosure together with the description.

DETAILED DESCRIPTION OF THE EMBODIMENTS

Figure 1:
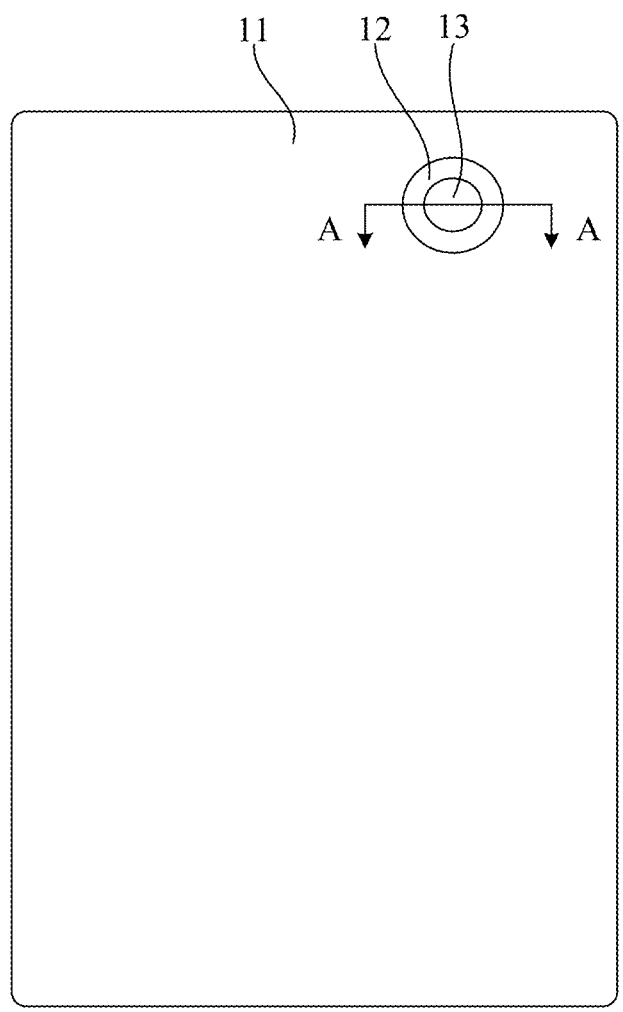
FIG. 1 is a structural schematic diagram of a display panel according to one or more implementations of the present disclosure.

Implementations will be described in detail herein, with the illustrations thereof represented in the drawings. When the following descriptions involve the drawings, like numerals in different drawings refer to like or similar elements unless otherwise indicated. The implementations described in the following examples do not represent all implementations consistent with the present disclosure. Rather, they are merely examples of apparatuses and methods consistent with some aspects of the present disclosure as detailed in the appended claims.

Before a method for manufacturing a display panel in the implementations of the present disclosure is introduced, a display panel in the implementations of the present disclosure will be firstly introduced below.

Figure 2:
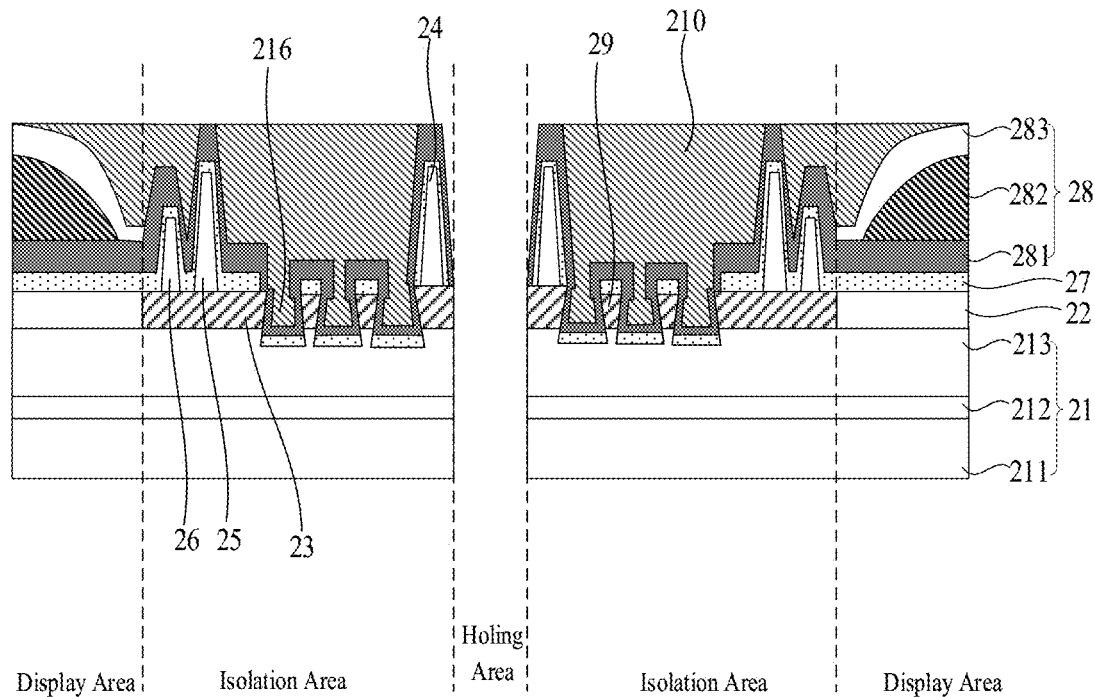
FIG. 2 is a sectional view taken along a line A-A in FIG. 1.
Figure 3:
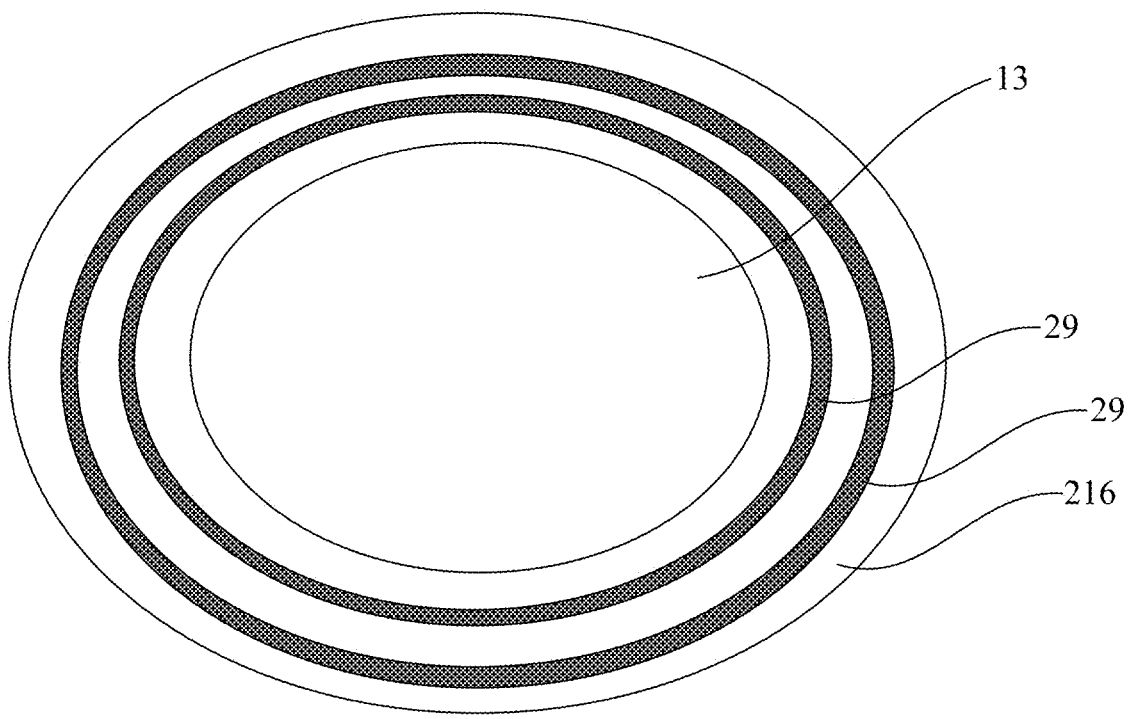
FIG. 3 is a structural schematic diagram of isolation columns and grooves in an isolation area, and a holing area in a display panel of FIG. 1.

As shown in FIGS. 1-3, an implementation of the present disclosure provides a display panel. FIG. 2 is a sectional view taken along a straight line A-A in FIG. 1.

As shown in FIG. 1, the display panel includes a display area 11, a holing area 13 and an isolation area 12. The isolation area 12 is disposed between the display area 11 and the holing area 13, and the isolation area 12 at least partially surrounds the holing area 13. For example, when a partial boundary of the holing area 13 is overlapped with a partial boundary of the display area 11, the isolation area 12 partially surrounds the holing area 13; when the boundary of the holing area 13 is not overlapped with the boundary of the display area 11, the isolation area 12 surrounds the holing area 13.

As shown in FIG. 2, the display panel includes a substrate 21, a buffer layer (not shown), an isolation layer (not shown), a drive circuit layer 22, a support layer 23, a first dam 24, a second dam 25, a third dam 26, an organic light-emitting material layer 27, a cathode layer (not shown), a packaging layer 28, a plurality of isolation columns 29, an organic filling layer 210 and a plurality of grooves 216.

The buffer layer is disposed on the substrate 21 and in the display area 11. The isolation layer is disposed in the display area 11 and on the buffer layer. A material of the buffer layer can be silicon nitride, and a material of the isolation layer can be silicon oxide. The drive circuit layer 22 is disposed in the display area 11 and on the isolation layer. The drive circuit layer 22 can include an anode of a pixel. The support layer 23 is disposed on the substrate, and the support layer 23 is disposed in the holing area 13 and the isolation area 12. The first dam 24, the second dam 25 and the third dam 26 are disposed on the support layer 23 to avoid overflow of organic matter, for example, the overflow of organic matter in the organic filling layer. The organic light-emitting material layer 27 is disposed in the display area 11 and the isolation area 12, one part of the organic light-emitting material layer 27 is disposed on the drive circuit layer 22, the support layer 23, the first dam 24, the second dam 25, the third dam 26 and the isolation columns 29, and another part of the organic light-emitting material layer 27 falls into the grooves 216 via openings of the grooves 216. The organic light-emitting material layer 27 is cut off at side walls of the grooves 216 or at side walls of the isolation columns 29. A bottom surface of the groove 216 can be disposed in the support layer 23 or in an organic layer of the substrate 21. An area of the bottom surface of the groove 216 is greater than an area of the opening of the groove 216. The isolation columns 29 and the grooves 216 are distributed alternately. An area of a surface of the isolation column 29 away from the substrate 21 is greater than an area of a bottom surface of the isolation column 29 close to the substrate 21. The cathode layer is disposed on the organic light-emitting material layer 27, the packaging layer 28 is disposed on the cathode layer, and the organic filling layer 210 is filled in an accommodation space formed by a surface of the packaging layer 28 away from the substrate 21, so that a surface of the display panel away from the substrate 21 is flush.

As shown in FIG. 2, the substrate 21 can include a first organic layer 211, an inorganic layer 212 and a second organic layer 213. The bottom surface of the groove 216 can be disposed in the second organic layer 213 of the substrate 21.

As shown in FIG. 3, when the isolation column 29 surrounds the holing area 13, the isolation column 29 can be annular. The number of the isolation columns 29 is one, two or more.

In an implementation, only the first dam 24 can be included. In another implementation, the second dam 25 or the third dam 26 can be included. In another implementation, the first dam 24 and the second dam 25 can be included. In another implementation, the first dam 24 and the third dam 26 can be included. In another implementation, the first dam 24, the second dam 25 and the third dam 26 can be included.

The above descriptions are made to the display panel in the implementations of the present disclosure. A method for manufacturing a display panel in the implementations of the present disclosure will be described below.

Figure 4:
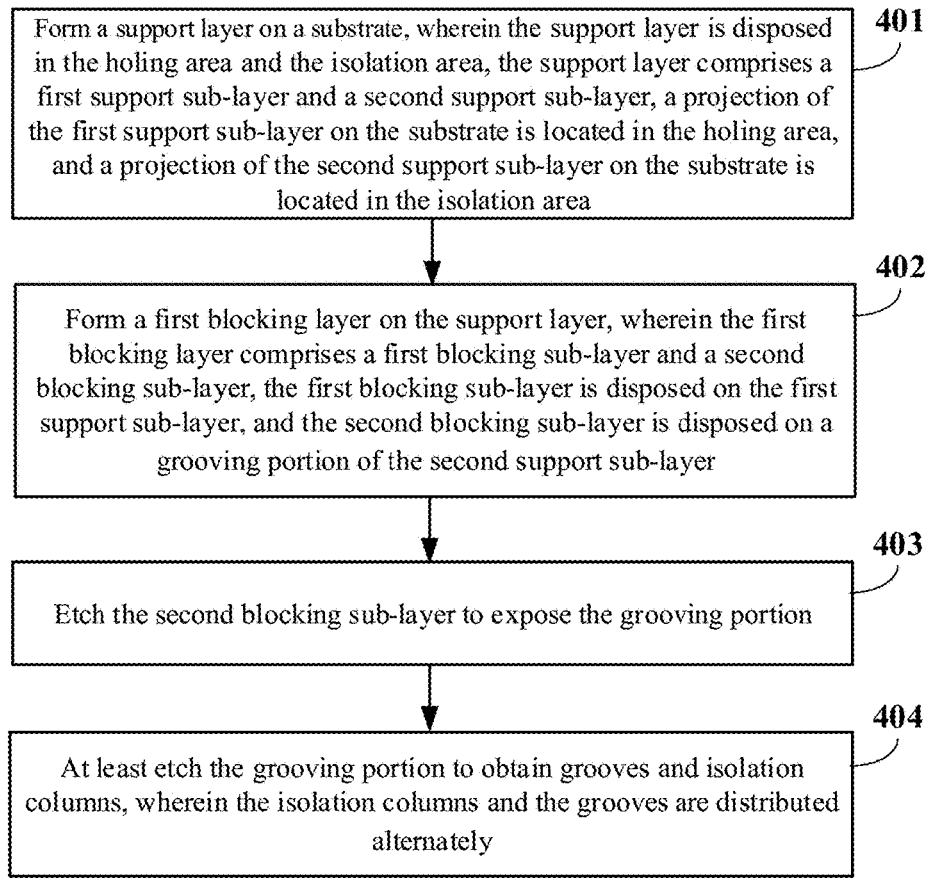
FIG. 4 is a flowchart of a method for manufacturing a display panel according to one or more implementations of the present disclosure.

An implementation of the present disclosure provides a method for manufacturing a display panel. As shown in FIG. 4, in this implementation, the method for manufacturing a display panel includes the following steps 401-404.

At step 401, a support layer is formed on a substrate, wherein the support layer is located in a holing area and an isolation area, the support layer includes a first support sub-layer and a second support sub-layer, a projection of the first support sub-layer on the substrate is located in the holing area, and a projection of the second support sub-layer on the substrate is located in the isolation area.

Figure 5:
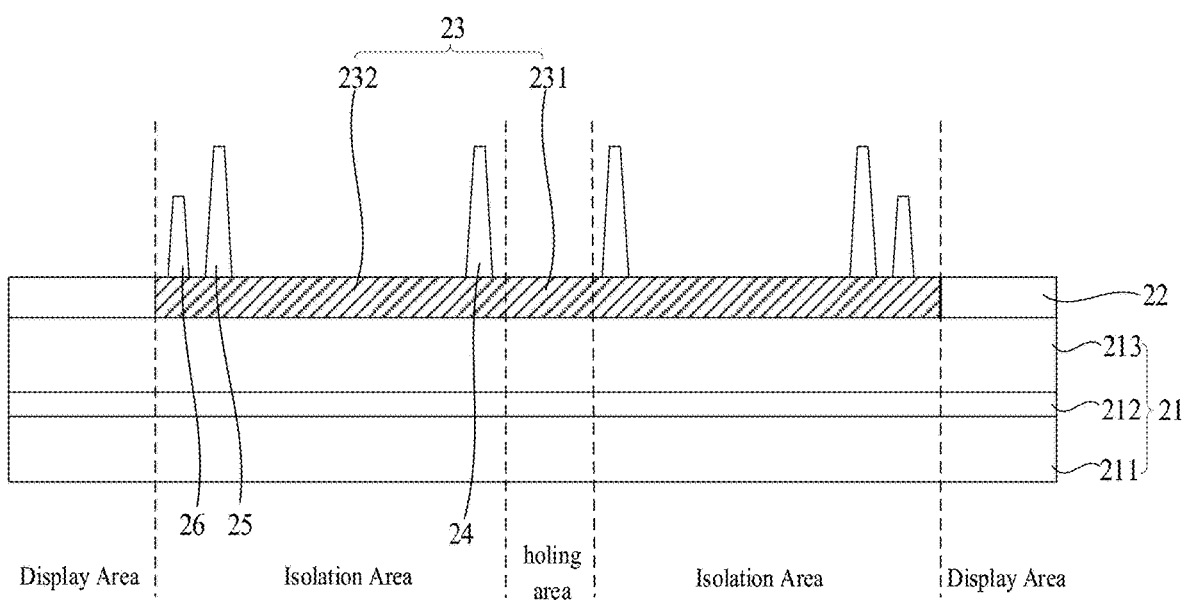
FIG. 5 is a structural schematic diagram of a semi-finished structure generated in a process of manufacturing a display panel according to one or more implementations of the present disclosure.

In this step, as shown in FIG. 5, the support layer 23 can be formed on a part of the substrate 21 corresponding to the holing area and the isolation area. The support layer 23 includes a first support sub-layer 231 and a second support sub-layer 232, the projection of the first support sub-layer 231 on the substrate 21 is located in the holing area 13, and the projection of the second support sub-layer 232 on the substrate 21 is located in the isolation area 12.

At step 402, a first blocking layer is formed on the support layer, wherein the first blocking layer includes a first blocking sub-layer 611 and a second blocking sub-layer 612, the first blocking sub-layer 611 is disposed on the first support sub-layer 231, and the second blocking sub-layer 612 is disposed on a grooving portion of the second support sub-layer 232.

Figure 6:
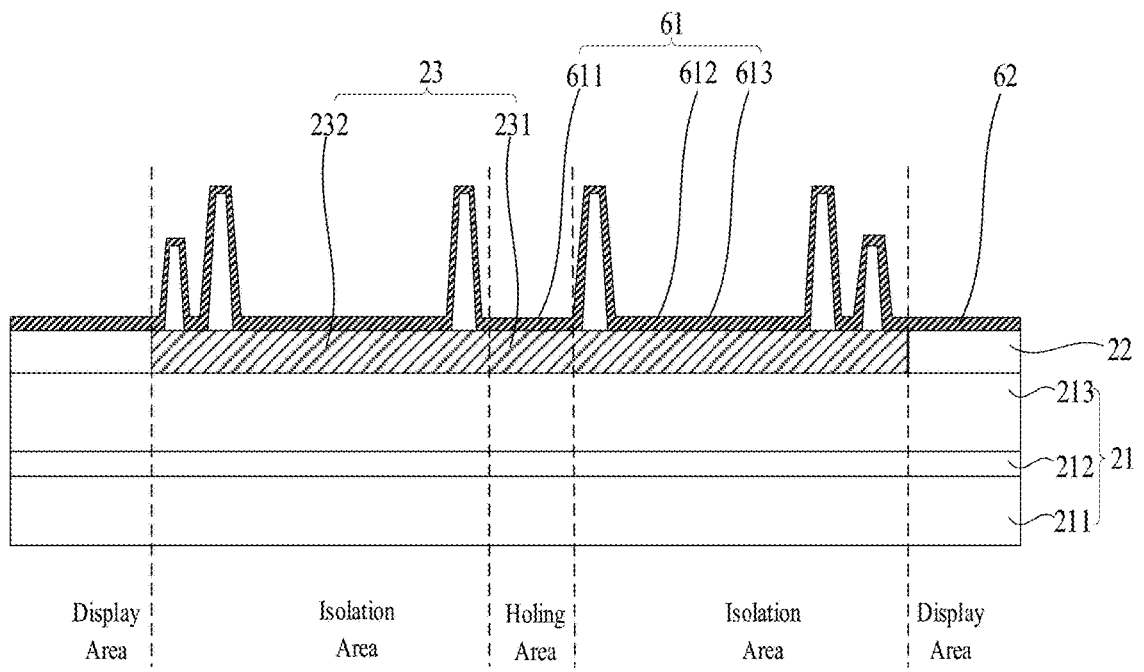
FIG. 6 is a structural schematic diagram of another semi-finished structure generated in a process of manufacturing a display panel according to one or more implementations of the present disclosure.

In this step, as shown in FIG. 6, the first blocking layer 61 is formed on the support layer 23, and the first blocking layer 61 includes a first blocking sub-layer 611 and a second blocking sub-layer 612. The first blocking sub-layer 611 is disposed on the first support sub-layer 231, and the second blocking sub-layer 612 is disposed on the grooving portion (not shown) of the second support sub-layer 232. The grooving portion of the second support sub-layer 232 is a part where a groove will be formed by grooving in a subsequent manufacturing process, and the grooves 216 can be obtained by grooving the grooving portion. Referring to FIG. 6 again, the first blocking layer 61 further includes a third blocking sub-layer 613. The third blocking sub-layer 613 is formed on a remaining portion of the second support sub-layer 232 other than the grooving portion. The third blocking sub-layer 613, the first blocking sub-layer 611 and the second blocking sub-layer 612 can be formed simultaneously.

At step 403, the second blocking sub-layer 612 is etched to expose the grooving portion.

Figure 7:
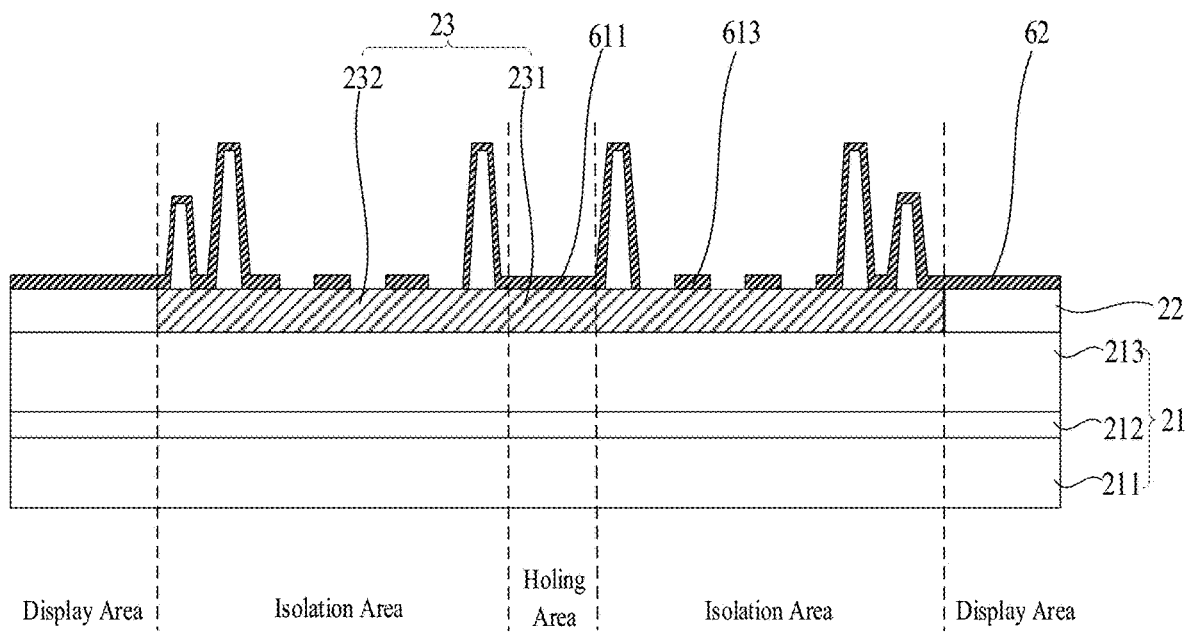
FIG. 7 is a structural schematic diagram of another semi-finished structure generated in a process of manufacturing a display panel according to one or more implementations of the present disclosure.

In this step, the second blocking sub-layer 612 is etched to obtain a structure as shown in FIG. 7. After the second blocking sub-layer 612 is etched, the above grooving portion can be exposed.

At step 404, at least the grooving portion is etched to obtain grooves and isolation columns, wherein the isolation columns and the grooves are distributed alternately.

Figure 8:
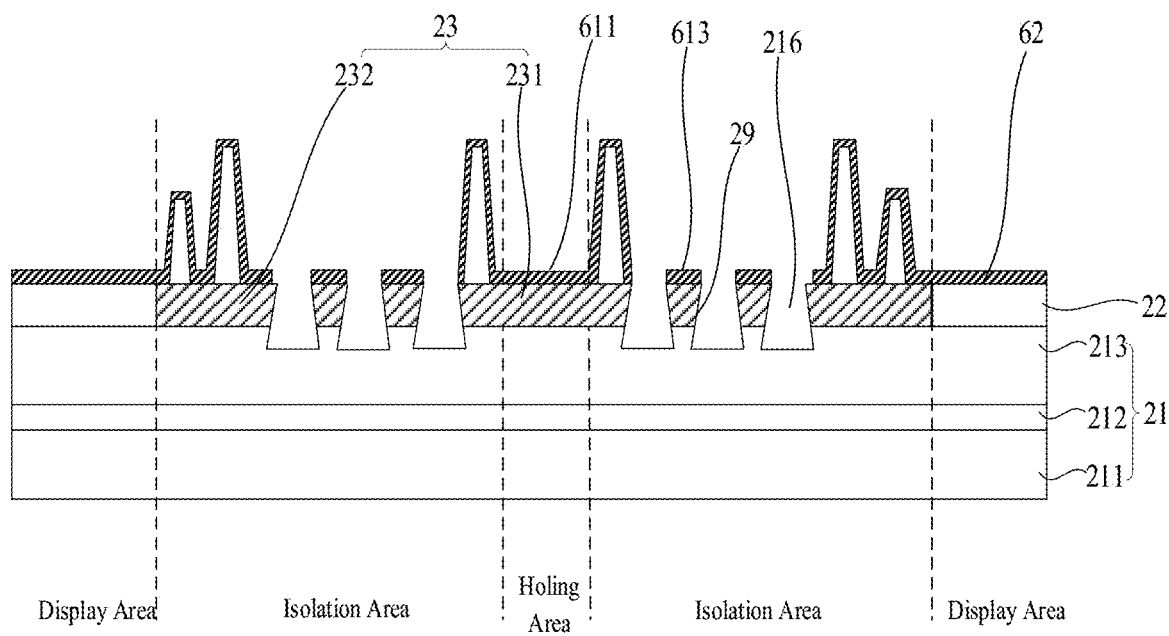
FIG. 8 is a structural schematic diagram of another semi-finished structure generated in a process of manufacturing a display panel according to one or more implementations of the present disclosure.

In this step, the grooves 216 and the isolation columns 29 can be obtained by etching the above grooving portion. The structure obtained in this step is shown in FIG. 8, the isolation columns 29 and the grooves 216 are distributed alternately, for example, along a direction from the holing area to the display area, the isolation columns 29 and the grooves 216 are distributed alternately. Furthermore, an area of a bottom surface of the groove 216 can be formed to be greater than an area of an opening of the groove 216; an area of a surface of the isolation column away from the substrate 21 can be formed to be greater than an area of a bottom surface of the isolation column 29 close to the substrate 21.

In the implementation, the first support sub-layer 231 disposed in the holing area and the second support sub-layer 232 disposed in the isolation area are formed in the substrate, the first blocking sub-layer 611 is formed on the first support sub-layer 231 and the second blocking sub-layer 612 is formed on the grooving portion of the second support sub-layer 232. Then, the second blocking sub-layer is etched to expose the grooving portion, and the grooves and the isolation columns are obtained by etching at least the grooving portion, wherein the isolation columns 29 and the grooves 216 are distributed alternately. In this case, when an organic light-emitting material layer is evaporated, the organic light-emitting material layer will be automatically cut off at a side wall of the groove or at a side wall of the isolation column without using external force, so as to block the path of diffusion of water and oxygen, prevent water and oxygen from diffusing from the holing area to the display panel, avoid interference of external devices (for example, laser device) and reduce the costs.

Figure 9:
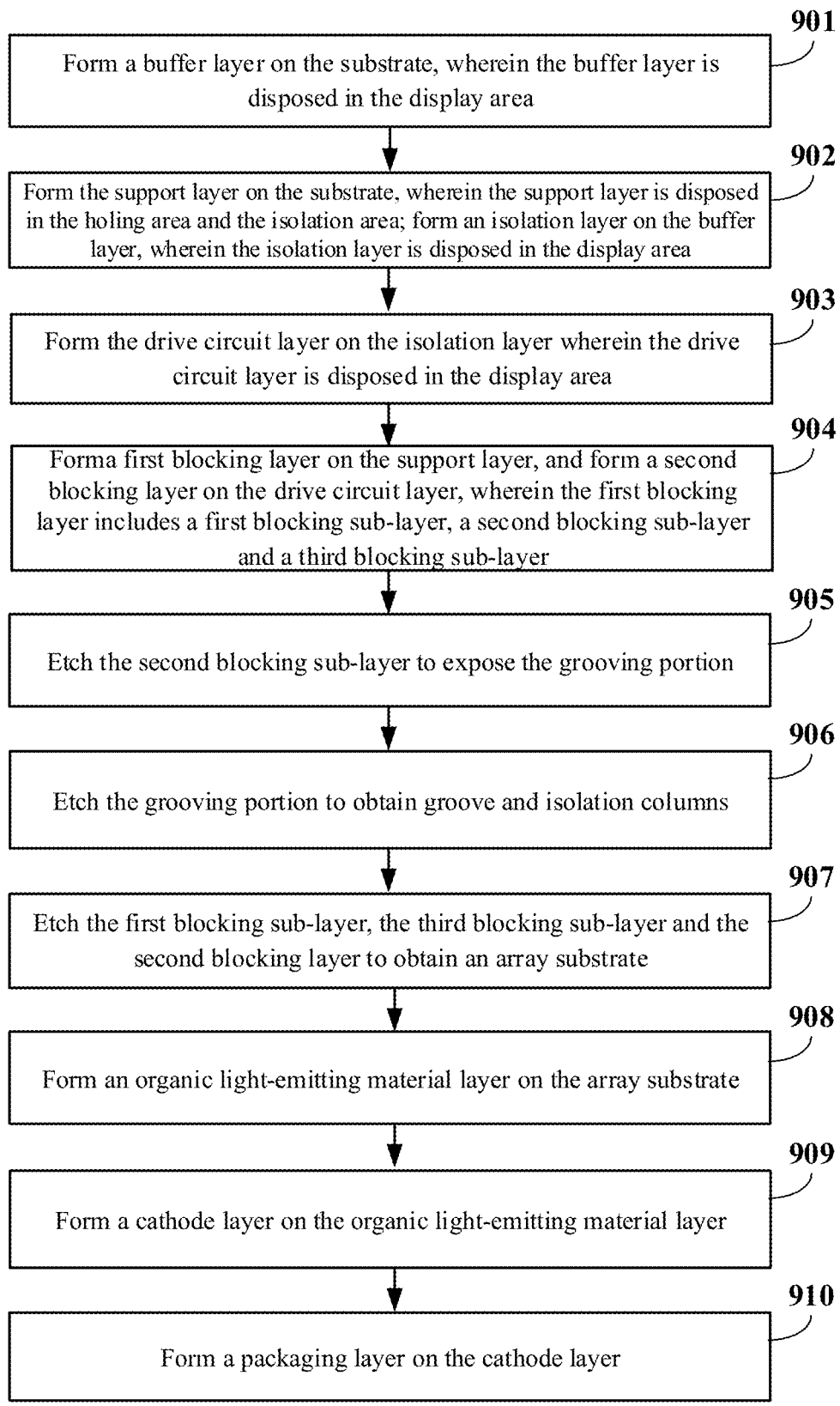
FIG. 9 is a flowchart of a method for manufacturing a display panel according to one or more implementations of the present disclosure.

Another implementation of the present disclosure provides a method for manufacturing a display panel. As shown in FIG. 9, in this implementation, the method for manufacturing a display panel can include the following steps 901-910.

At step 901, a buffer layer is formed on the substrate 21, wherein the buffer layer is disposed in the display area.

In this step, the buffer layer is formed on a part of the substrate 21 corresponding to the display area 11. A material of the buffer layer can be silicon nitride.

At step 902, the support layer 23 is formed on the substrate 21, wherein the support layer 23 is disposed in the holing area 13 and the isolation area 12; an isolation layer is formed on the buffer layer, wherein the isolation layer is disposed in the display area.

In this step, the support layer 23 can be formed on a part of the substrate 21 corresponding to the holing area 13 and the isolation area 12. In addition, the isolation layer is formed on a part of the substrate 21 corresponding to the display area. The support layer 23 and the isolation layer are formed in a same manufacturing process. A material of the support layer can be silicon oxide, and a material of the isolation layer can be silicon oxide. Because the support layer 23 and the isolation layer can be formed in a same manufacturing process, production steps and costs can be reduced.

In this implementation, the first dam 24, the second dam 25 and the third dam 26 can be further formed on the support layer 23. When the isolation area 12 surrounds the holing area 13, the first dam 24, the second dam 25 and the third dam 26 can be annular.

At step 903, the drive circuit layer is formed on the isolation layer, wherein the drive circuit layer is disposed in the display area.

In this step, as shown in FIG. 5, the drive circuit layer 22 can be formed on the isolation layer, and the drive circuit layer 22 is disposed in the display area 11. A surface of the drive circuit layer 22 away from the substrate 21 is flush with a surface of the support layer 23 away from the substrate 21.

At step 904, a first blocking layer is formed on the support layer, and a second blocking layer is formed on the drive circuit layer, wherein the first blocking layer includes a first blocking sub-layer, a second blocking sub-layer and a third blocking sub-layer.

In this step, as shown in FIG. 6, the first blocking layer 61 can be formed on the support layer 23, and the second blocking layer 62 can be formed on the drive circuit layer 22, wherein the first blocking layer 61 includes the first blocking sub-layer 611, the second blocking sub-layer 612 and the third blocking sub-layer 613.

In this implementation, a surface of the second blocking layer 62 away from the substrate 21 is flush with a surface of the first blocking layer 61 away from the substrate 21.

In this implementation, a material of the first blocking layer 61 is indium tin oxide (ITO), indium gallium oxide (IGO), or indium gallium zinc oxide (IGZO).

In this implementation, a material of the second blocking layer 62 is indium tin oxide, indium gallium oxide or indium gallium zinc oxide.

Preferably, the material of the second blocking layer 62 is same as the material of the first blocking layer 61, and the second blocking layer 62 and the first blocking layer 61 are formed in a same manufacturing process. Because the second blocking layer and the first blocking layer are formed in a same manufacturing process, production steps and costs can be reduced.

At step 905, the second blocking sub-layer is etched to expose the grooving portion.

In this step, the structure shown in FIG. 7 can be obtained by etching the second blocking sub-layer 612. After the second blocking sub-layer 612 is etched, the above grooving portion can be exposed.

In this implementation, the second blocking sub-layer 612 can be wet etched, and composition of acid used for wet etching can include phosphoric acid. In another implementation, the composition of the acid used for wet etching can include oxalic acid. In another implementation, the composition of the acid used for wet etching can include acetic acid. In another implementation, the composition of the acid used for wet etching can include oxalic acid and acetic acid. In another implementation, the composition of the acid used for wet etching can include phosphoric acid, oxalic acid and acetic acid. In one word, the composition of the acid used for wet etching can include at least one of phosphoric acid, oxalic acid and acetic acid.

Figure 10:
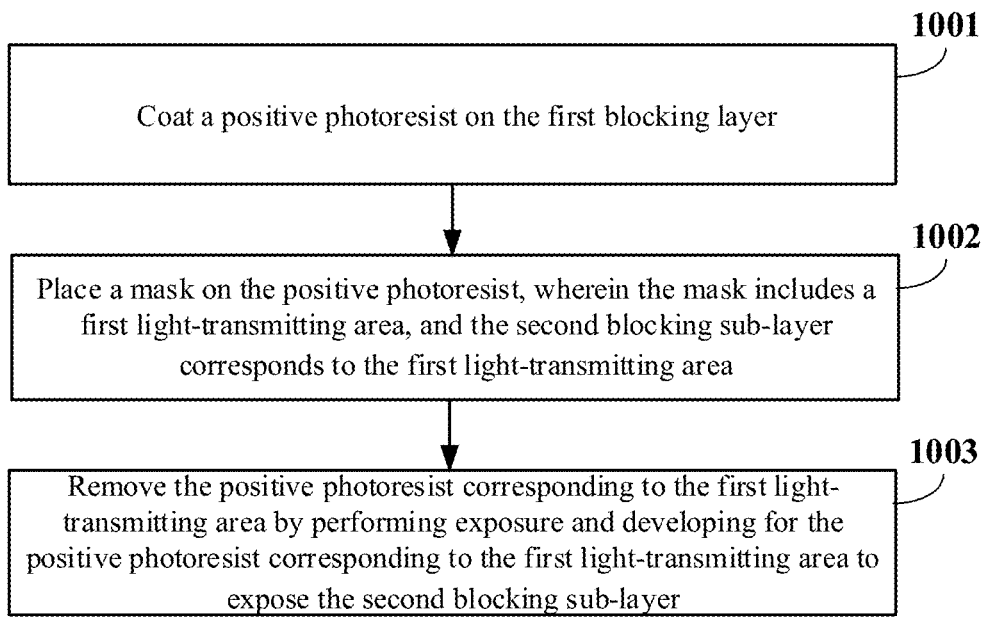
FIG. 10 is a flowchart of a method for manufacturing a display panel according to one or more implementations of the present disclosure.

In this implementation, as shown in FIG. 10, before step 905, the following steps 1001-1003 may be performed.

At step 1001, a positive photoresist is coated on the first blocking layer.

At step 1002, a mask is placed on the positive photoresist, wherein the mask includes a first light-transmitting area, and the second blocking sub-layer corresponds to the first light-transmitting area.

At step 1003, the positive photoresist corresponding to the first light-transmitting area is removed by performing exposure and developing for the positive photoresist corresponding to the first light-transmitting area to expose the second blocking sub-layer.

In this implementation, a positive photoresist can also be coated on the second blocking layer 62, and coating the positive photoresist on the second blocking layer 62 and coating the positive photoresist on the first blocking layer 61 are completed in a same manufacturing process. The positive photoresist coated on the second blocking layer 62 corresponds to a non-light-transmitting area of the mask.

In step 906, grooves and isolation columns are obtained by etching the grooving portion.

In this step, the grooves 216 and the isolation columns 29 can obtained by etching the grooving portion of the second support sub-layer 232 and the second organic layer 213 in the substrate. The structure obtained in this step is as shown in FIG. 8.

Figure 11:
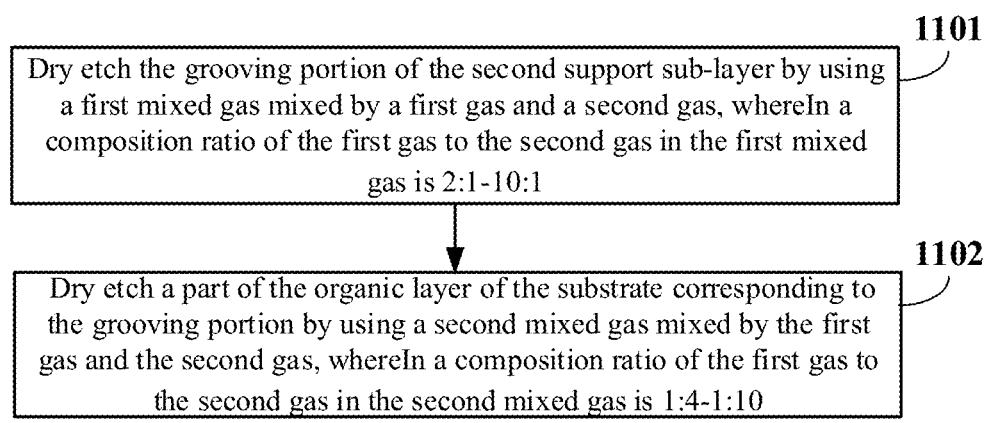
FIG. 11 is a flowchart of a method for manufacturing a display panel according to one or more implementations of the present disclosure.

In this implementation, as shown in FIG. 11, the step 906 can include the following steps 1101-1102.

At step 1101, the grooving portion of the second support sub-layer is dry etched by using a first mixed gas mixed by a first gas and a second gas, wherein a composition ratio of the first gas to the second gas in the first mixed gas is 2:1-10:1.

For example, the composition ratio of the first gas to the second gas in the first mixed gas is 2:1, or, the composition ratio of the first gas to the second gas in the first mixed gas is 5.5:1, or, the composition ratio of the first gas to the second gas in the first mixed gas is 10:1.

In an implementation, the first gas can include at least one of carbon tetrafluoride ($CF_4$) and sulfur tetrafluoride ($SF_4$), and the second gas is oxygen. For example, the first gas includes carbon tetrafluoride, or the first gas includes sulfur tetrafluoride, or the first gas includes carbon tetrafluoride and sulfur tetrafluoride.

In this step, an area of the bottom surface of the groove is made to be greater than an area of the opening of the groove by controlling a parameter of the etching process.

At step 1102, a part of the organic layer of the substrate corresponding to the grooving portion is dry etched by using a second mixed gas mixed by the first gas and the second gas, wherein a composition ratio of the first gas to the second gas in the second mixed gas is 1:4-1:10.

For example, the composition ratio of the first gas to the second gas in the second mixed gas is 1:4, or the composition ratio of the first gas to the second gas in the second mixed gas is 1:7, or the composition ratio of the first gas to the second gas in the second mixed gas is 1:10.

In this step, when the part of the organic layer of the substrate corresponding to the grooving portion is dry etched by using the second mixed gas with the composition ratio of the first gas to the second gas being 1:4-1:10, the second support sub-layer can be protected.

In this implementation, a power for dry etching is 2000-10000 watts. For example, the power for dry etching can be 2000 watts, or 5500 watts, or 10000 watts.

Of course, in another implementation, the grooves 216 and the isolation columns 29 can also be obtained by only etching the grooving portion of the second support sub-layer 232.

At step 907, an array substrate is obtained by etching the first blocking sub-layer, the third blocking sub-layer and the second blocking layer.

In this step, the first blocking sub-layer, the third blocking sub-layer and the second blocking layer are wet etched.

Preferably, composition of acid used for wet etching can include at least one of phosphoric acid, oxalic acid and acetic acid. Specifically, in an implementation, the composition of the acid used for wet etching can include oxalic acid. In another implementation, the composition of the acid used for wet etching can include acetic acid. In another implementation, the composition of the acid used for wet etching can include oxalic acid and acetic acid. In another implementation, the composition of the acid used for wet etching can include phosphoric acid, oxalic acid and acetic acid. Since the composition of the acid used for wet etching includes at least one of phosphoric acid, oxalic acid and acetic acid, damage to an anode in the drive circuit layer can be prevented.

Figure 12:
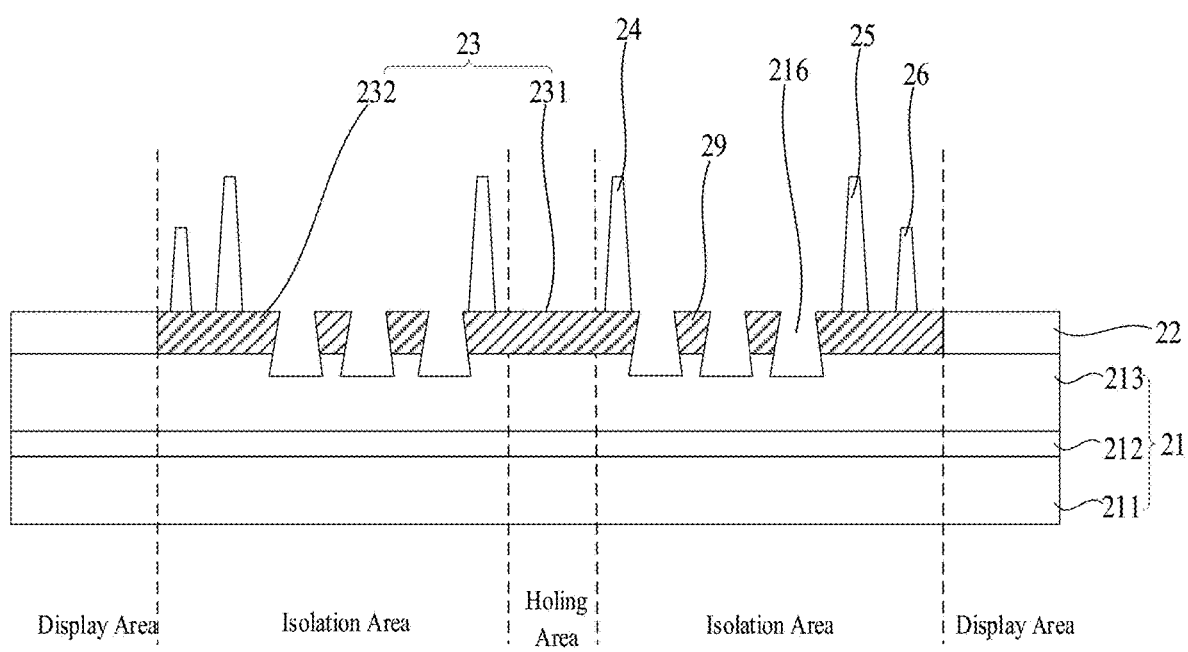
FIG. 12 is a structural schematic diagram of another semi-finished structure generated in a process of manufacturing a display panel according to one or more implementations of the present disclosure.

In this step, the array substrate obtained is as shown in FIG. 12.

The shape of the isolation column is not limited to inverted trapezoid shown in FIG. 12, and can also be shaped like T or a horizontal H.

At step 908, an organic light-emitting material layer is formed on the array substrate.

In this step, the organic light-emitting material layer 27 can be formed by evaporating the organic light-emitting material on the array substrate.

At step 909, a cathode layer is formed on the organic light-emitting material layer.

In this step, the cathode layer can be formed on the organic light-emitting material layer 27.

In this implementation, a material of the cathode layer can be a magnesium-silver alloy, a magnesium-aluminum alloy, a lithium-aluminum alloy and the like, or a single metal such as magnesium, aluminum, lithium or silver, which is not limited herein.

At step 910, a packaging layer is formed on the cathode layer.

In this step, the packaging layer 28 can be formed on the cathode layer. As shown in FIG. 2, the packaging layer 28 can include first organic packaging layer 281, an inorganic packaging layer 282, and a second organic packaging layer 283.

After step 910, a hole can be obtained in the holing area 13, and then the display panel as shown in FIG. 2 can be obtained.

Figure 13:
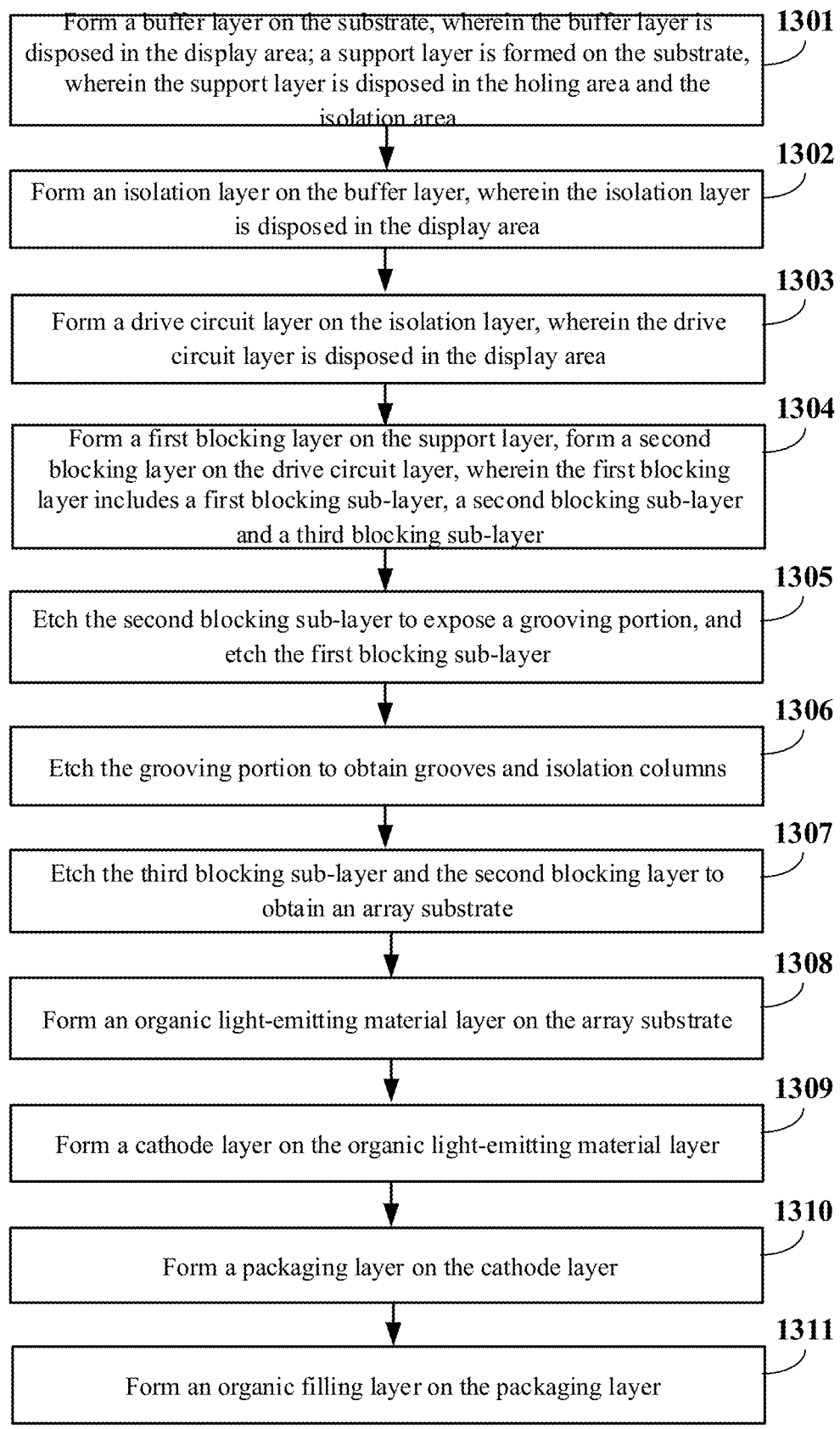
FIG. 13 is a flowchart of a method for manufacturing a display panel according to one or more implementations of the present disclosure.

Another implementation of the present disclosure provides a method for manufacturing a display panel. As shown in FIG. 13, in this implementation, the method for manufacturing a display panel includes the following steps 1301-1311.

At step 1301, a buffer layer is formed on the substrate, wherein the buffer layer is disposed in the display area; a support layer is formed on the substrate, wherein the support layer is disposed in the holing area and the isolation area.

In this step, the buffer layer is formed on the substrate 21, wherein the buffer layer is disposed in the display area, and the material of the buffer layer can be silicon nitride. At the same time, the support layer is formed on the substrate 21, wherein the support layer is disposed in the holing area 13 and the isolation area 12.

Preferably, the material of the support layer is same as the material of the buffer layer. The support layer and the buffer layer are formed in a same manufacturing process. Because the support layer and the buffer layer are formed in a same manufacturing process, production steps and costs can be reduced.

At step 1302, an isolation layer is formed on the buffer layer, wherein the isolation layer is disposed in the display area.

In this step, the isolation layer can be formed on the buffer layer, and the material of the isolation layer can be silicon oxide.

At step 1303, a drive circuit layer is formed on the isolation layer, wherein the drive circuit layer is disposed in the display area.

In this step, the drive circuit layer 22 can be formed on the isolation layer, and a surface of the drive circuit layer 22 away from the substrate 21 is flushed with a surface of the support layer 23 away from the substrate 21.

At step 1304, a first blocking layer is formed on the support layer, a second blocking layer is formed on the drive circuit layer, wherein the first blocking layer includes a first blocking sub-layer, a second blocking sub-layer and a third blocking sub-layer.

The step 1304 in this implementation is similar to the above step 904 and thus will not be redundantly described.

At step 1305, the second blocking sub-layer is etched to expose a grooving portion, and the first blocking sub-layer is etched.

In this step, the second blocking sub-layer 612 and the first blocking sub-layer 611 can be etched at the same time, that is, the first blocking sub-layer 611 and the second blocking sub-layer 612 are etched in a same manufacturing process.

In this implementation, the second blocking sub-layer 612 and the first blocking sub-layer 611 can be wet etched, and composition of acid used for wet etching can include at least one of phosphoric acid, oxalic acid and acetic acid.

Figure 14:
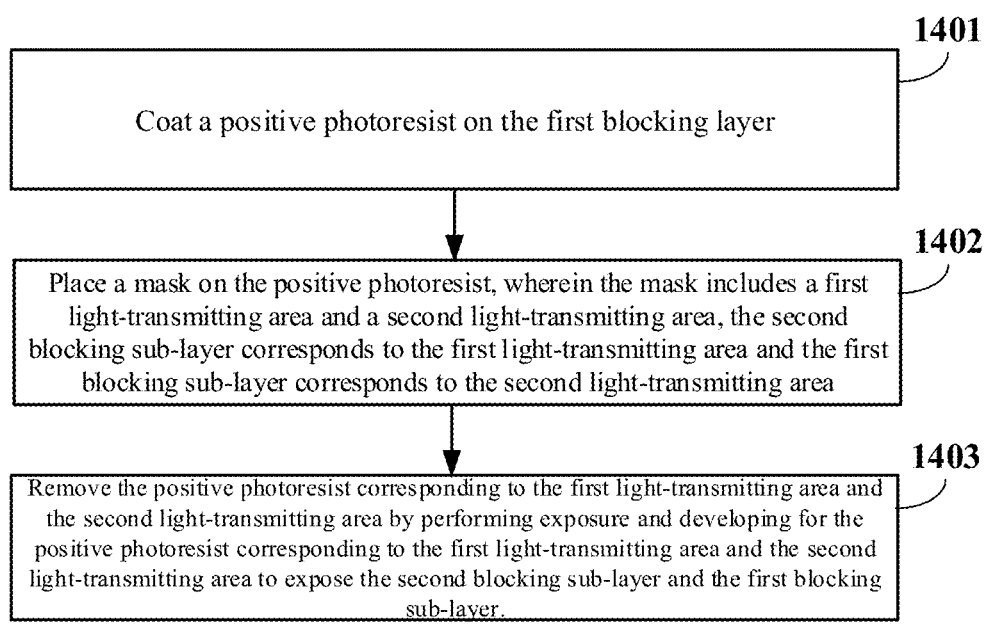
FIG. 14 is a flowchart of a method for manufacturing a display panel according to one or more implementations of the present disclosure.

In this implementation, as shown in FIG. 14, before step 1305, the following steps 1401-1403 can be included.

At step 1401, a positive photoresist is coated on the first blocking layer.

At step 1402, a mask is placed on the positive photoresist, wherein the mask includes a first light-transmitting area and a second light-transmitting area, the second blocking sub-layer corresponds to the first light-transmitting area and the first blocking sub-layer corresponds to the second light-transmitting area.

At step 1403, the positive photoresist corresponding to the first light-transmitting area and the second light-transmitting area is removed by performing exposure and developing for the positive photoresist corresponding to the first light-transmitting area and the second light-transmitting area to expose the second blocking sub-layer and the first blocking sub-layer.

In this implementation, the positive photoresist can also be coated on the second blocking layer 62, and coating the positive photoresist on the second blocking layer 62 and coating the positive photoresist on the first blocking layer 61 are completed in a same manufacturing process. The positive photoresist coated on the second blocking layer 62 corresponds to a non-light-transmitting area of the mask. The mask includes the first light-transmitting area and the second light-transmitting area, the second blocking sub-layer corresponds to the first light-transmitting area and the first blocking sub-layer corresponds to the second light-transmitting area. The positive photoresist corresponding to the first light-transmitting area and the second light-transmitting area can be removed by performing exposure and developing for the positive photoresist corresponding to the first light-transmitting area and the second light-transmitting area to expose the second blocking sub-layer and the first blocking sub-layer, thus facilitating subsequent etch.

At step 1306, grooves and isolation columns are obtained by etching the grooving portion.

In this implementation, only for a part of the second blocking sub-layer corresponding to the grooving portion can be dry etched.

In this step, the part of the second blocking sub-layer corresponding to the grooving portion can be dry etched by using a first mixed gas mixed by a first gas and a second gas, wherein a composition ratio of the first gas to the second gas in the first mixed gas is 6:1.

In this implementation, a power for dry etching is 6000 watts.

At step 1307, an array substrate is obtained by etching the third blocking sub-layer and the second blocking layer.

In this step, the array substrate shown in FIG. 12 can be obtained by wet etching the third blocking sub-layer and the second blocking layer. Composition of acid used for wet etching can include at least one of phosphoric acid, oxalic acid and acetic acid. Since the composition of the acid used for wet etching includes at least one of phosphoric acid, oxalic acid and acetic acid, damage to an anode in the drive circuit layer can be prevented.

At step 1308, an organic light-emitting material layer is formed on the array substrate.

At step 1309, a cathode layer is formed on the organic light-emitting material layer.

At step 1310, a packaging layer is formed on the cathode layer.

The steps 1308-1310 in this implementation are similar to the steps 908-910 of the above implementations and thus will not be repeated herein.

At step 1311, an organic filling layer is formed on the packaging layer.

In this implementation, because a surface of the packaging layer away from the substrate 21 is uneven, an organic adhesive can be filled on the packaging layer 28 to form the organic filling layer 210. Because an accommodation space formed by the surface of the packaging layer away from the substrate is filled with the organic filling layer, damage to the grooves by subsequent manufacturing steps can be avoided. Furthermore, breakage of wires in the subsequent manufacturing steps can be avoided and poor bubbling is also prevented.

In the above implementation, the material of the support layer is silicon nitride or silicon oxide. In another implementation, the material of the support layer can be a metal. For example, the material of the support layer can be a sandwich structure of titanium-aluminum-titanium, or a sandwich structure of molybdenum-aluminum-molybdenum. The drive circuit layer 22 can include a wire-connecting layer which is a sandwich structure of titanium-aluminum-titanium or a sandwich structure of molybdenum-aluminum-molybdenum. The support layer and the wire-connecting layer can be formed in a same manufacturing process.

An implementation of the present disclosure further provides a display device including a device body and the display panel according to any one above implementation.

The device body includes a component area where at least one electronic component is disposed. The display panel covers the device body, and the electronic component is embedded into a hole formed in the holing area.

In an implementation, the above electronic component can include at least one of distance sensor, microphone, loudspeaker, flash light, pixel camera, infrared camera, flood light sensing element, ambient light sensor and dot projector, which is not limited herein.

The display device in the implementation can be any product or component having display function such as electronic paper, mobile phone, tablet computer, TV, laptop computer, digital photo frame or navigator.

The formation process in the above flow can include, for example, a film formation process such as deposition and sputtering, and a patterning process such as etching.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and implementations are considered as exemplary only, with a true scope and spirit of the present disclosure being indicated by the following claims.

The invention claimed is:

1. A method for manufacturing a display panel, wherein the display panel comprises a display area, a holing area and an isolation area, and the isolation area is disposed between the display area and the holing area, and the isolation area at least partially surrounds the holing area, wherein the method comprises:
   forming a support layer on a substrate, wherein the support layer is disposed in the holing area and the isolation area, the support layer comprises a first support sub-layer and a second support sub-layer, a projection of the first support sub-layer on the substrate is located in the holing area, and a projection of the second support sub-layer on the substrate is located in the isolation area;
   forming a first blocking layer on the support layer, wherein the first blocking layer comprises a first blocking sub-layer and a second blocking sub-layer, the first blocking sub-layer is disposed on the first support sub-layer, and the second blocking sub-layer is disposed on a grooving portion of the second support sub-layer;
   etching the second blocking sub-layer to expose the grooving portion;
   at least etching the grooving portion to obtain grooves and isolation columns, wherein the isolation columns and the grooves are distributed alternately;
   forming a drive circuit layer on the substrate, wherein the drive circuit layer is disposed in the display area, and a surface of the drive circuit layer away from the substrate is flushed with a surface of the support layer away from the substrate; and
   forming a second blocking layer on the drive circuit layer, wherein a surface of the second blocking layer away from the substrate is flushed with a surface of the first blocking layer away from the substrate;
   wherein, after at least etching the grooving portion to obtain the grooves and the isolation columns, the method further comprises:
   wet etching the first blocking sub-layer, a third blocking sub-layer and the second blocking sub-layer to obtain an array substrate.

2. The method according to claim 1, wherein the third blocking sub-layer is formed on a remaining portion of the second support sub-layer other than the grooving portion.

3. The method according to claim 1, wherein an area of a bottom surface of the groove is greater than an area of an opening of the groove, and an area of a surface of the isolation column away from the substrate is greater than an area of a bottom surface of the isolation column close to the substrate.

4. The method according to claim 1, further comprising:
   forming a buffer layer on the substrate, wherein the buffer layer is disposed in the display area, and the support layer and the buffer layer are formed in a same manufacturing process; or,
   forming a buffer layer on the substrate, wherein the buffer layer is disposed in the display area;
   forming an isolation layer on the buffer layer, wherein the isolation layer is disposed in the display area, and the support layer and the isolation layer are formed in a same manufacturing process.

5. The method according to claim 1, wherein,
   the second blocking layer and the first blocking layer are formed in a same manufacturing process.

6. The method according to claim 1, wherein,
   the drive circuit layer comprises a wire-connecting layer; the support layer and the wire-connecting layer are formed in a same manufacturing process.

7. The method according to claim 1, wherein,
   a material of the first blocking layer is indium tin oxide (ITO), indium gallium oxide (IGO), or indium gallium zinc oxide (IGZO); a material of the second blocking layer is indium tin oxide (ITO), indium gallium oxide (IGO) or indium gallium zinc oxide (IGZO).

8. The method according to claim 1, wherein before etching the second blocking sub-layer, the method comprises:
   coating a positive photoresist on the first blocking layer;
   placing a mask on the positive photoresist, wherein the mask comprises a first light-transmitting area, and the second blocking sub-layer corresponds to the first light-transmitting area;
   removing the positive photoresist corresponding to the first light-transmitting area by performing exposure and developing for the positive photoresist corresponding to the first light-transmitting area to expose the second blocking sub-layer;

wherein etching the second blocking sub-layer comprises:

wet etching the second blocking sub-layer to expose the grooving portion.

9. The method according to claim 1, further comprising:

etching the first blocking sub-layer, wherein the first blocking sub-layer and the second blocking sub-layer are etched in a same manufacturing process.

10. The method according to claim 9, wherein etching the first blocking sub-layer and the second blocking sub-layer in a same manufacturing process comprises:

coating a positive photoresist on the first blocking layer;

placing a mask on the positive photoresist, wherein the mask comprises a first light-transmitting area and a second light-transmitting area, the second blocking sub-layer corresponds to the first light-transmitting area, and the first blocking sub-layer corresponds to the second light-transmitting area;

removing the positive photoresist corresponding to the first light-transmitting area and the second light-transmitting area by performing exposure and developing for the positive photoresist corresponding to the first light-transmitting area and the second light-transmitting area to expose the second blocking sub-layer and the first blocking sub-layer;

wet etching the first blocking sub-layer and the second blocking sub-layer.

11. The method according to claim 10, wherein, a composition of acid used for wet etching, wherein the composition of acid comprises at least one of phosphoric acid, oxalic acid or acetic acid.

12. The method according to claim 1, wherein at least etching the grooving portion to obtain the grooves and the isolation columns comprises:

dry etching the grooving portion of the second support sub-layer by using a first mixed gas mixed by a first gas and a second gas, wherein a composition ratio of the first gas to the second gas in the first mixed gas is 2:1-10:1;

the substrate comprising an organic layer, and dry etching the grooving portion corresponding to the organic layer of the substrate by using a second mixed gas mixed by the first gas and the second gas, wherein a composition ratio of the first gas to the second gas in the second mixed gas is 1:4-1:10.

13. The method according to claim 12, wherein, the first gas comprises at least one of carbon tetrafluoride or sulfur tetrafluoride, and the second gas comprises oxygen, and/or, a material of the support layer is silicon nitride or silicon oxide, and/or, a power for dry etching is 2000-10000 watts.

14. The method according to claim 1, further comprising:

forming an organic light-emitting material layer on the array substrate;

forming a cathode layer on the organic light-emitting material layer;

forming a packaging layer on the cathode layer.

15. The method according to claim 14, wherein the substrate comprises an organic layer, the organic light-emitting material layer is cut off at a side wall of the groove or a side wall of the isolation column, and a bottom surface of the groove is disposed in the support layer or in the organic layer of the substrate.

16. The method according to claim 15, further comprising:

forming an organic filling layer on the packaging layer, wherein the organic filling layer is filled in an accommodation space formed by a surface of the packaging layer away from the substrate.

17. A display panel, manufactured by the method for manufacturing a display panel according to claim 1.

18. A display device, comprising:

a device body comprising a component area; and, the display panel according to claim 17, wherein the display panel covers the device body, and the holing area of the display panel corresponds to the component area.

* * * * *